United States Patent
Fiess et al.

(10) Patent No.: US 10,453,974 B2
(45) Date of Patent: Oct. 22, 2019

(54) CONDUCTIVE PASTE COMPRISING A SILICONE OIL

(71) Applicant: BASF SE, Ludwigshafen am Rhein (DE)

(72) Inventors: Markus Fiess, Mannheim (DE); Han Chang Pan, Taichung (TW); Yu Lin Wang, Taoyuan (TW); Chia Chin Cho, Taoyuan (TW)

(73) Assignee: BASF SE, Ludwigshafen am Rhein (DE)

( * ) Notice: Subject to any disclaimer, the term of this patent is extended or adjusted under 35 U.S.C. 154(b) by 0 days.

(21) Appl. No.: 16/078,176

(22) PCT Filed: Feb. 23, 2017

(86) PCT No.: PCT/EP2017/054105
§ 371 (c)(1),
(2) Date: Aug. 21, 2018

(87) PCT Pub. No.: WO2017/144555
PCT Pub. Date: Aug. 31, 2017

(65) Prior Publication Data
US 2019/0051774 A1    Feb. 14, 2019

(30) Foreign Application Priority Data
Feb. 23, 2016   (EP) ..................... 16156961

(51) Int. Cl.
*H01L 31/0224*  (2006.01)
*H01L 21/70*    (2006.01)
(Continued)

(52) U.S. Cl.
CPC ........ *H01L 31/022425* (2013.01); *C03C 4/14* (2013.01); *C03C 8/18* (2013.01);
(Continued)

(58) Field of Classification Search
CPC . H01L 21/705; H01L 31/022425; C03C 8/18; H01B 1/24; Y02E 10/50
See application file for complete search history.

(56) References Cited

U.S. PATENT DOCUMENTS 6,017,587 A     1/2000  Kleyer et al.
2009/0250106 A1* 10/2009 Hayashi .......... H01L 31/022425
                                                     136/256
(Continued)

FOREIGN PATENT DOCUMENTS

EP      0971367 A1   1/2000
JP      2010-87251 A 4/2010
(Continued)

OTHER PUBLICATIONS

International Search Report dated May 17, 2017, in PCT/EP2017/054105, filed Feb. 23, 2017.
(Continued)

*Primary Examiner* — Stephen W Smoot
(74) *Attorney, Agent, or Firm* — Oblon, McClelland, Maier & Neustadt, L.L.P.

(57) ABSTRACT

The invention relates to a conductive paste comprising from 30 to 97% by weight of electrically conductive particles, from 0 to 20% by weight of a glass frit, from 3 to 70% by weight of an organic medium and from 0.1 to 67% by weight of a silicone oil, each based on the total mass of the paste, wherein the silicone oil has a boiling point or a boiling range in the range between 180° C. and 350° C. The invention further relates to a use of the conductive paste and a process for producing electrodes on a semiconductor substrate using the paste.

12 Claims, 2 Drawing Sheets

(51) Int. Cl.
*H01B 1/02* (2006.01)
*H01B 1/22* (2006.01)
*C03C 4/14* (2006.01)
*C03C 8/18* (2006.01)
*H01B 1/12* (2006.01)

(52) U.S. Cl.
CPC .............. *H01B 1/02* (2013.01); *H01B 1/124* (2013.01); *H01B 1/22* (2013.01); *H01L 21/705* (2013.01); *C03C 2204/00* (2013.01); *C03C 2205/00* (2013.01); *Y02E 10/50* (2013.01)

(56) References Cited

U.S. PATENT DOCUMENTS

| | | |
|---|---|---|
| 2010/0090176 A1 | 4/2010 | Kosowsky et al. |
| 2010/0126582 A1* | 5/2010 | Yamasaki ............ G02B 5/0808 136/256 |
| 2011/0083874 A1 | 4/2011 | Kuroki |
| 2012/0255765 A1 | 10/2012 | Kuroki |
| 2013/0126797 A1 | 5/2013 | Lee et al. |
| 2014/0124713 A1 | 5/2014 | Majumdar et al. |
| 2015/0249167 A1* | 9/2015 | Zhang ...................... H01B 1/22 427/123 |
| 2016/0358687 A1* | 12/2016 | Zhang ...................... C08J 3/205 |
| 2017/0117422 A1* | 4/2017 | Chang ............. H01L 31/022425 |

FOREIGN PATENT DOCUMENTS

| | | |
|---|---|---|
| KR | 10-2009-0067992 A | 6/2009 |
| KR | 10-0923741 B1 | 10/2009 |
| WO | WO 2011/055995 A2 | 5/2011 |

OTHER PUBLICATIONS

International Preliminary Report on Patentability, dated May 8, 2018, in PCT/EP2017/054105, filed Feb. 23, 2017.
U.S. Appl. No. 15/736,013, filed Jun. 28, 2018, 2018-0182506, Gao et al.

* cited by examiner

CONDUCTIVE PASTE COMPRISING A SILICONE OIL

The invention relates to a conductive paste comprising from 30 to 97% by weight of electrically conductive particles, from 3 to 70% by weight of an organic medium and from 0 to 20% by weight of a glass frit.

Conductive pastes or inks can be used to form electrodes, such as conductive grid lines, for example silver grid lines, and bus bars on the surface of semiconductor substrates or substrates from an insulating material. A particularly preferred use is screen printing of electrodes on semiconductor substrates for the production of solar cells or photovoltaic cells which convert solar energy to electrical energy when photons from sunlight excite electrons on semiconductors from the valance band to the conduction band. The electrons which flow to the conduction band are collected by the metal electrodes that contact the semiconductors.

Besides printing electrodes on semiconductor substrates for producing solar cells or photovoltaic cells, conductive pastes or inks can be used for printing grid lines on insulating substrates for producing printed electronic circuit boards or hybrid circuits on ceramic substrates.

To print fine lines onto either a semiconductor substrate or an insulating substrate, generally screen printing processes are used for cost efficient mass production. Nevertheless, to generate uniform narrow lines without line interruptions is challenging for screen printing, particularly for high speed screen printing. The industrial printing speed depends on the application requirement. It ranges from 80 mm/s to 800 mm/s, preferably not slower than 150 mm/s, for example in solar cell printing, the printing speed is 150 mm/s to 300 mm/s.

Screens for screen printing are manufactured by covering selected areas in meshes of stainless steel wires with a polymer layer which is called screen emulsion. During the screen printing process the paste can only flow through the areas of the screen which are not covered by the screen emulsion. For this reason the screen printing paste has to show minimum adhesion on the surface of the stainless steel wires and on the surface of the screen emulsion.

When the conductive paste is used for printing on semiconductor substrates, the paste usually comprises electrically conductive particles, which typically are metal powders, an organic medium and optionally a glass frit. The organic medium typically comprises at least one organic liquid, such as organic solvents or organic salts or other organic compounds having liquid form at room temperature. The organic medium comprises optionally a polymeric component. To form metal contacts, the conductive paste is printed onto a substrate. Depending on the type of materials, the substrate is then heated at a temperature in the range from about 150° C. to about 950° C., where the organic medium is decomposed and the inorganic species form the conductive tracks and electrical contact to the substrate.

Pastes for printing electrodes on semiconductor substrates, for example for producing solar cells, are disclosed for example in JP-A 2010-087251, KR-A 10-2009-0067992 or US-A 2014/0124713.

However, to be used in screen printing processes, a paste has to be released in a quantitative way from the surfaces of the materials the screen is made of and completely transferred to the surface of the substrate. On the other hand, the paste must show sufficient adhesion on the surface of the substrate the paste is printed on to achieve fine lines which have a sufficient thickness and do not show any interruptions.

Therefore it has been an object of the invention to provide a conductive paste which can be printed by screen printing without adhering in a too strong way on the material of the screen and which has a sufficient adhesion to form fine grid lines without seepage on the substrate on which the paste is printed.

Figure 1:
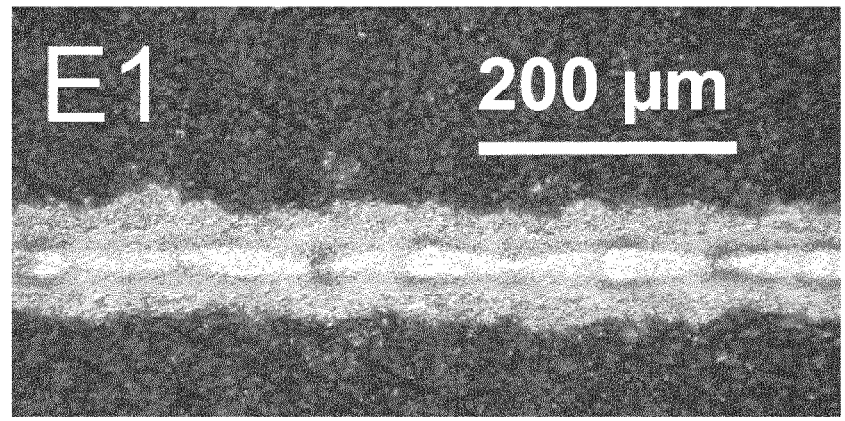
FIG. 1 shows microscope pictures of printed lines of the paste composition E1 after drying at 250° C. and subsequent sintering at 800° C.

This object is achieved by a conductive paste comprising from 30 to 97% by weight of electrically conductive particles, from 0 to 20% by weight of a glass frit, from 3 to 70% by weight of an organic medium and from 0.1 to 67% by weight of a silicone oil, each based on the total mass of the paste, wherein the silicone oil has a boiling point or a boiling range in the range between 180° C. and 350° C.

Silicone oils can comprise only one kind of silicone oil molecule or different kinds of silicone oil molecules. Silicone oil molecules contain the elements silicon, oxygen, carbon and hydrogen. In silicone oil molecules silicon atoms are interconnected via one to four oxygen atoms with other silicon atoms. Each silicon atom forms 4 covalent bonds with other atoms, which can be either oxygen atoms or methyl groups.

Silicone oil molecules can be cyclic, branched or linear. Typical examples for cyclic silicone oil molecules are decamethylcyclopentasiloxane, dodecamethylcyclohexasiloxane or tetradecamethylcycloheptasilxane. Typical examples for linear silicone oil molecules are decamethyltetrasiloxane, dodecamethylpentasiloxane, tetradecamethylhexasiloxane and hexadecamethylheptasiloxane.

If a silicone oil contains only one single type of molecule then this silicone oil has a defined boiling point at normal pressure of 1013 mbar. Pure hexamethyldisiloxane for example has a boiling point of 100.0° C. If a silicone oil contains several different types of molecules then this silicone oil exhibits a boiling range which depends on the chemical composition of the silicone oil. At the lower end of a boiling range the most volatile component of a silicone oil changes from the liquid phase of the silicone oil into the gas phase. At the upper end of the boiling range the least volatile component of a silicone oil changes from the liquid phase of the silicone oil into the gas phase. The upper end of the boiling range of a silicone oil can be defined by the least volatile component of a silicone oil which does evaporate but not chemically decompose.

Physical properties of silicone oils depend on the chemical structure of contained silicone oil molecules. In case of linear silicone oils an increase of molecular weight causes an increase of the boiling point, a reduction of vapour pressure at constant temperature, a reduction of diffusion speed in paste formulations, an increase of surface tension and an increase of viscosity.

Copolymers of silicone oil molecules and other chemical species like polyethers are commonly used as surface active components in various applications like defoaming, adhesion control, dispersion and wetting.

Such copolymers of silicone oils and other chemical species are disclosed for example in KR 10-0923741, JP2010087251A2 and US2014/0124713A1.

At temperatures above 25° C. and ambient pressure silicones either evaporate or decompose. Hexamethyldisiloxane has a boiling point of 100° C. which is the lowest boiling point of all silicone oil molecules. All other silicone oil molecules have a larger molecular weight and therefore a higher boiling point and a lower vapour pressure at constant temperature. When silicone oil molecules are heated from 25° C. to 800° C. then it depends on the heating rate and on the type of silicone oil molecule whether the molecule is evaporated or chemically decomposed.

In complex formulations like metallization pastes which comprise silicone oil molecules it depends also on the total composition of the formulation whether a silicone oil molecule is evaporated or chemically decomposed during heating with a defined heating rate. Vapour pressure and diffusion speed of the silicone oil molecule will determine whether a silicone oil molecule can reach the paste surface and transfer to the gas phase via an evaporation process or whether a silicone oil molecule chemically decomposes inside the paste volume during paste sintering.

During heating from 25° C. to 800° C. chemical decomposition of silicone oil molecules comprises the formation of carbon dioxide, water and silica. Carbon dioxide and water transfer to the gas phase at temperatures above 100° C. However, silica is a solid even at a temperature as high as 800° C. Furthermore silica is an electrically nonconductive material which increases the specific resistivity of metal electrodes which are formed via screen printing of metal pastes with subsequent paste drying and firing at elevated temperatures. Therefore addition of silicone oil to formulations of metallization pastes appears to be detrimental for optimum line conductivity.

On the other hand volatile liquid components in metallization pastes can cause fast paste drying during screen printing at 25° C. and ambient pressure. A loss of liquid paste components during screen printing causes a change of paste rheology with detrimental effects on print performance. An increase of paste viscosity due to fast evaporation of liquid components can result in screen prints of interrupted electrodes because of insufficient paste flow through narrow line openings of screen emulsions.

Silicone oils are widely used due to their unique chemical and physical properties. The low polarity of silicone oil molecules enables only weak attractive forces between silicone oil molecules and other chemical species. For this reason silicone oil molecules are part of coatings for reduction of adhesion and used as release agents for thermal molding of rubber, plastics and low-melting metals.

Furthermore silicone oils exhibit a very low surface tension which is the reason for their unique wetting properties of various surfaces. Stainless steel for instance has a very high surface energy. For this reason stainless steel tries to minimize its surface energy by adsorbing any kind of material.

Surprisingly it has been found that a paste which comprises an organic medium and a silicone oil with a boiling point range between 180° C. and 350° C. does significantly improve the print quality during screen printing of conductive pastes on semiconductors, for example for producing solar cells. Said silicone oils significantly improve the release of the conductive paste from the narrow openings of screen emulsions because they wet very efficiently the metal wires of the stainless steel screen mesh. The wetting of the stainless steel wires of the screen mesh with silicone oil molecules during the screen print reduces adhesion of the metallization paste on the stainless steel wires and supports the efficient paste release from the stainless steel surface.

An additional unexpected result was the measurement of equal solids content of two pastes wherein in the second paste only the solvent blend of the first paste has been substituted by silicone oil. This means that silicone oil with a boiling point range between 180° C. and 350° C. does not result in the formation of nonconductive residues of silica as a product of chemical decomposition of silicone oil molecules during paste drying or paste firing at elevated temperatures.

In a preferred embodiment of the present invention the paste contains 0.1% to 50% by weight of a silicone oil with a boiling point or a boiling range in the range between 180° C. and 350° C. Preferred is a boiling point or a boiling range in the range between 190° C. and 300° C. and particularly preferred is a boiling point or a boiling range in the range between 200° C. and 270° C. The amount of the organic medium in the paste preferably is 3% to 70% by weight and the amount of electrically conductive particles preferably is 30% to 97% by weight.

In the scope of the present invention the term "boiling range in the range between" is to be understood that the minimum value and the maximum value of the boiling range each are in the range between the temperatures limiting the range but that the minimum value and the maximum value do not necessarily correspond to the temperatures limiting the range in which the boiling range lies.

The silicone oil preferably comprises polydimethylsiloxane molecules.

In one embodiment of the invention, the silicone oil contains linear silicone oil molecules. If linear silicone oil molecules are used then the silicone oil molecules are preferably selected from decamethyltetrasiloxane, dodecamethylpentasiloxane, tetradecamethylhexasiloxane, hexadecamethylheptasiloxane or mixtures thereof.

In another embodiment of the invention, the silicone oil contains cyclic silicone oil molecules. If cyclic silicone oil molecules are used then the silicone oil molecules are preferably selected from decamethylcyclopentasiloxane, dodecamethylcyclohexasiloxane, tetradecamethylcycloheptasiloxane or mixtures thereof.

Besides the use of linear silicone oil molecules, branched silicone oil molecules or cyclic silicone oil molecules it is also possible to use at least two of the aforementioned types of silicone oil molecules. Independently of the form of the silicone oil molecules, either linear, branched or cyclic or a mixture of at least two thereof, it is particularly preferred when the silicone oil molecules are polydimethylsiloxanes.

The electrically conductive particles present in the electrically conductive paste may be particles of any geometry composed of any electrically conductive material. Preferably, the electrically conductive particles comprise carbon, silver, gold, aluminum, platinum, palladium, tin, nickel, cadmium, gallium, indium, copper, zinc, iron, bismuth, cobalt, manganese, molybdenum, chromium, vanadium, titanium, tungsten, or mixtures or alloys thereof or are in the form of core-shell structures thereof. Preferred as material for the electrically conductive particles are silver or aluminum, particularly silver due to good conductivity and good oxidation resistance.

The mean particle size of the electrically conductive particles preferably is in the range from 10 nm to 100 μm. More preferably, the mean particle size is in the range from 100 nm to 50 μm and particularly preferred, the mean particle size is in the range from 500 nm to 10 μm. The electrically conductive particles may have any desired form known to those skilled in the art. For example, the particles may be in the form of flakes, rods, wires, nodules, spheres or any mixtures thereof. Spherical particles in context of the present invention also comprise particles with a real form which deviates from the ideal spherical form. For example, spherical particles, as a result of the production, may also have a droplet shape or be truncated. Suitable particles which can be used to produce the conductive paste are known to those skilled in the art and are commercially available. Particularly preferably, spherical silver particles are used. The advantage of the spherical particles is their improved rheological behavior compared to irregular shaped particles.

The proportion of electrically conductive particles in the composition is in the range from 30 to 97% by weight. The proportion is preferably in the range from 70 to 95% by weight and particularly preferred in the range from 85 to 92% by weight. This weight percentage of solid particles is often referred as solids content.

The particle shapes and sizes do not change the nature of this invention. Particles can be used as mixtures of different shapes and sizes. It is known to those skilled in the art that the particles with mixtures of different shapes or sizes can result in higher or lower viscosity when they are dispersed in the same organic medium. In such case, it is known to those skilled in the art that the organic medium needs to be adjusted accordingly. The adjustment can be but is not limited to variations of solids content, solvent content, polymer content, thixotrope content and/or surfactant content. As an example, typically when nano-sized particles are used to replace micron-sized particles, the solids content has to be reduced to avoid an increase of the viscosity of the paste, which results in higher contents of organic components.

The electrically conductive particles, especially when made of a metal, generally are coated with organic additives in the course of production. In the course of preparation of the composition for printing conductor tracks, the organic additives on the surface are typically not removed, such that they are then also present in the conductive paste. The proportion of additives for stabilization is generally not more than 10% by weight, based on the mass of particles. The additives used to coat the electrically conductive particles may, for example, be fatty amines or fatty amides, for example dodecylamine. Further additives suitable for stabilizing the particles are, for example, octylamine, decylamine, and polyethyleneimines. Another embodiment may be fatty acids, fatty acid esters, with or without epoxylation, for example, lauric acid, palmitic acid, oleic acid, stearic acid, or a salt thereof. The coating on the particles does not change the nature of this invention.

In an embodiment, the conductive paste additionally comprises a glass frit. If a glass frit is present in the paste, any glass frit known to a skilled person can be used, either based on lead-containing compositions or on lead-free compositions. The glass frit is not bound to any particular shape or form. The mean particle size of the particles of the glass frit used is in the range from 10 nm to 100 µm. The mean particle size of the glass frit particles is more preferably in the range from 100 nm to 50 µm and particularly preferred in the range from 500 nm to 10 µm. The particles used may have any desired form known to those skilled in the art. For example, the particles may be in the form of flakes, rods, wires, nodules, spheres or any mixture thereof. Spherical particles in this context mean that the real form of the particles deviates from the ideal spherical form, for example, spherical particles, as a result of the production, may also have a droplet shape or be truncated. Suitable particles which can be used as glass frit are known to those skilled in the art and are commercially available. Especially preferred, spherical particles are used. The advantage of spherical particles is their improved rheological behavior compared to irregular shaped particles. According to the invention, the glass frit content is in the range from 0 to 20% by weight, preferably from 0 to 10% by weight and most preferably from 1 to 5% by weight, based on the total mass of the conductive paste.

The organic medium in the conductive paste may comprise at least one solvent. In one embodiment of the invention, the solvent comprises one or more solvents selected from liquid organic components having at least one oxygen atom. The liquid organic component having at least one oxygen atom is selected from alcohol, ester alcohol, glycol, glycol ether, ketone, fatty acid ester, terpene derivatives and dibasic esters. The liquid organic component for example may be benzyl alcohol, texanol, ethyl lactate, diethylene glycol monoethyl acetate, diethylene glycol monobutylether, diethylene glycol dibutylether, diethylene glycol monobutylether acetate, butyl cellosolve, butyl cellosolve acetate, propylene glycol monometylether, propylene glycol monomethylether acetate, dipropylene glycol monomethylether, propylene glycol monomethylpropionate, ethylether propionate, dimethylamino formaldehyde, methylethylketone, gamma-butyrolactone, ethyl linoleate, ethyl linolenate, ethyl myristate, ethyl oleate, methyl myristate, methyl linoleate, methyl linolenate, methyl oleate, dibutyl phthalate, dioctyl phthalate and terpineol.

The solvent being a liquid organic component having at least one oxygen atom can be used in the conductive paste either as single solvent or as a solvent mix. In case a solvent mix is used, the solvent can additionally comprise 5 to 50 wt % of at least one dibasic ester based on the total mass of the solvent mixture. The dibasic ester preferably is selected from dimethyl esters of adipic acid, glutaric acid, succinic acid or mixtures thereof.

When either a single solvent or a solvent mixture is used, it is necessary that organic binders can be dissolved greater than 2 wt % in the selected single or mixed solvents, such that the organic medium comprises at least 2 wt % dissolved binder based on the total mass of the organic medium.

In an embodiment of the invention, the paste additionally comprises from 0.1 to 20 wt % of at least one additive selected from surfactants, thixotropic agents, plasticizers, solubilizers, defoamers, desiccants, crosslinkers, inhibitors, complexing agents and/or conductive polymer particles. The additives may be used individually or as a mixture of two or more of them.

When a surfactant is used as an additive, it is possible to use only one surfactant or more than one surfactant. In principle, all surfactants which are known to those skilled in the art or are described in the prior art, can be suitable. Preferred surfactants are singular or plural compounds, for example anionic, cationic, amphoteric or nonionic surfactants. However, it is also possible to use polymers with pigment-affinitive anchor groups, which are known to a skilled person as surfactants.

In case the electrically conductive particles are pre-coated with a surfactant, the conductive paste may not comprise an additional surfactant as additive.

Besides the solvent and the further organic additives, the conductive paste also may comprise organic binders in a range from 0.1 to 20% by weight. The organic binder can be selected from natural or synthetic resins and polymers. As known to those skilled in the art, selections are based on but not limited to solvent compatibility and chemical stability. For example, the common binders as disclosed in the prior art comprise cellulose derivatives, acrylic resin, phenolic resin, urea-formaldehyde resin, alkyd resin, aliphatic petroleum resin, melamine formaldehyde resin, rosin, polyethylene, polypropylene, polystyrene, polyether, polyurethane, polyvinyl acetate and copolymers thereof.

The inventive paste particularly is used in screen printing processes for producing electrically conductive pattern on a substrate. Particularly preferred, the paste is used to print electrodes on semiconductors for producing solar cells.

The invention further is related to a process for producing electrodes on a semiconductor substrate comprising the steps of:
(a) screen printing a conductive paste as described above on a semiconductor substrate in a predetermined pattern to form a printed semiconductor substrate,
(b) drying the printed semiconductor substrate at a temperature in the range from 100 to 300° C.,
(c) heating the dried printed semiconductor substrate with the printed composition to a sintering temperature in the range from 600 to 900° C. to sinter the electrically conductive particles.

Suitable semiconductor substrates are for example such to produce photovoltaic cells comprising an n-type region, a p-type region, a p-n junction and conductive gridlines. Photovoltaic cells comprise optionally an anti-reflection layer on the surface of substrate. The semiconductor substrate can be mono-crystalline silicon, multi-crystalline silicon, amorphous silicon coated solid substrate, or a substrate whose surface is coated with polycrystalline or amorphous transparent conductive oxides (TCO), such as indium tin oxide (ITO), ZnO based transparent conductive oxides, such as indium gallium zinc oxide (IGZO), indium zinc tin oxide (IZTO), indium zinc oxide (IZO), indium tungsten oxide (IWO), gallium zinc oxide (GZO). The conductive gridlines are formed by the screen printing process from a conductive paste.

The screen printing in step (a) is carried out in any known manner known to a skilled person. The printing process particularly can be an industrial high speed screen printing process. In such a process the printing speed depends on the application requirement. It ranges from 80 mm/s to 800 mm/s, preferably not slower than 150 mm/s, for example in solar cell printing, the printing speed is 150 mm/s to 300 mm/s.

After printing the conductive paste on the semiconductor substrate, the printed semiconductor substrate is dried at a temperature in the range from 100 to 300° C. The drying step preferably is carried out for a duration in the range from 10 to 50 sec, particularly preferably in the range from 15 to 30 sec.

After drying, the dried printed semiconductor substrate is heated to a sintering temperature in the range from 600 to 900° C. to sinter the electrically conductive particles. In the heating step the printed semiconductor substrate is heated from the drying temperature to the sintering temperature within 5 to 50 sec, preferably within 5 to 35 sec, the sintering temperature is kept for less than 5 sec, and afterwards the printed semiconductor substrate is cooled down to room temperature within 3 to 60 sec, preferably within 3 to 30 sec. The whole heating step is carried out for a duration in the range from 10 to 80 sec, preferably from 15 to 50 sec.

EXAMPLES

Conductive pastes according to the compositions in table 1 have been screen printed with the screen parameters as shown in table 3.

TABLE 1

Paste composition

| | sample | |
|---|---|---|
| component | E1 mass % | E2 mass % |
| silver powder | 88.50 | 88.50 |
| glass frit | 3.00 | 3.00 |
| organic additive blend A | 1.25 | 1.25 |
| organic solvent blend A | 7.25 | 6.45 |
| silicone oil | 0.00 | 0.80 |
| sum | 100.00 | 100.00 |

In formulation E2 solvent blend A partially has been substituted by silicone oil. Organic additive blend A contains a mixture of a dispersants, polymers and thixotropes. Organic solvent blend A contains a mixture of texanol and dimethyl adipate.

Screen prints have been conducted with the following screen parameters:

TABLE 2

| screen parameters | |
|---|---|
| mesh count [wires/inch] | 360 |
| wire thickness [µm] | 16 |
| emulsion thickness [µm] | 15 |
| fabric thickness [µm] | 22 |
| line opening [µm] | 36 |
| number of lines | 100 |
| busbar type | 2 segmented |

TABLE 3

Slip measurement

| | sample | |
|---|---|---|
| | E1 | E2 |
| average rotation speed at 1000 Pa [rpm] | 1.89 | 2.12 |
| standard deviation of rotation speed at 1000 Pa [rpm] | 0.014 | 0.034 |

Formulation E2 shows less adhesion on the stainless steel surfaces of a rheometer with plate-plate geometry. Therefore in case of formulation E2 the upper plate shows faster rotation speed at constant shear stress.

Figure 2:
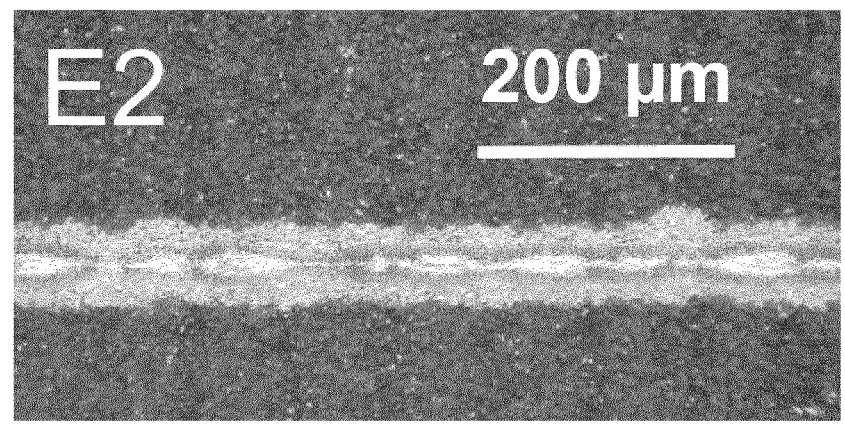
FIG. 2 shows microscope pictures of printed lines of the paste composition E2 after drying at 250° C. and subsequent sintering at 800° C.

Results of the printing process are shown in FIGS. 1 and 2.

FIGS. 1 and 2 show microscope pictures of printed lines of the paste compositions E1 and E2 after drying at 250° C. and subsequent sintering at 800° C. By comparison of the lines shown in FIGS. 1 and 2 it can be seen that the line printed with the inventive formulation E2 shows less seepage.

TABLE 4 characteristics of the printed lines

| | sample | |
|---|---|---|
| | E1 | E2 |
| median shaded line width [µm] | 86.1 | 66.4 |
| median line height [µm] | 13.4 | 16.4 |

Figure 3:
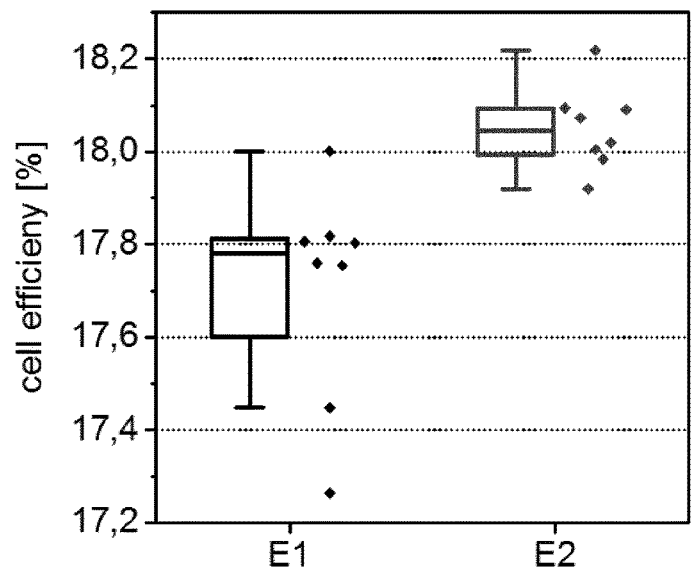
FIG. 3 shows results of cell efficiency measurements of paste compositions E1 and E2.

8 multi crystalline wafers have been screen printed with each of pastes E1 and E2. Results of cell efficiency measurements are shown in FIG. 3. Results of thermal gravimetric analysis are shown in FIG. 4.

From FIG. 3 it can be clearly seen, that the paste composition according to the invention which comprises a silicone oil has a higher cell efficiency than a paste composition which does not contain a silicone oil.

Figure 4:
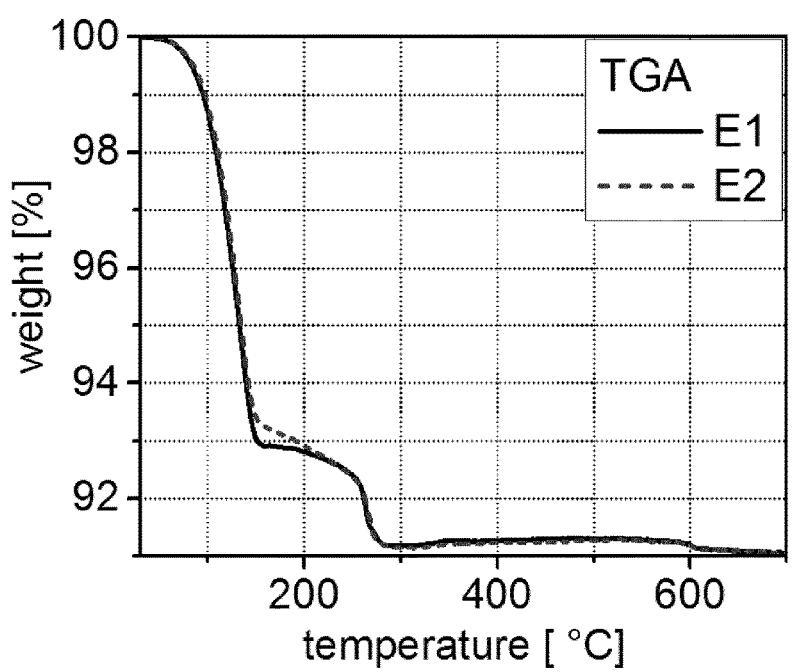
FIG. 4 shows results of thermal gravimetric analysis of paste compositions E1 and E2.

FIG. 4 shows that the mass reduction during the heating step for both pastes nearly is the same, which shows that during the heating step no silica is formed from the silicone oil which would lead to a reduction of cell efficiency.

The invention claimed is:

1. A conductive paste comprising:
   from 30 to 97% by weight of electrically conductive particles;
   from 1 to 20% by weight of a glass frit;
   from 3 to 70% by weight of an organic medium; and
   from 0.1 to 67% by weight of a silicone oil;
   wherein each % by weight is based on a total mass of the conductive paste; and
   wherein the silicone oil has a boiling point or a boiling range in a range between 180° C. and 350° C.

2. The conductive paste according to claim 1, wherein the silicone oil comprises at least one selected from the group consisting of a linear silicone oil molecule, a branched silicone oil molecule, and a cyclic silicone oil molecule.

3. The conductive paste according to claim 2, comprising the linear silicone oil molecule, wherein the linear silicone oil molecule is at least one selected from the group consisting of decamethyltetrasiloxane, dodecamethylpentasiloxane, tetradecamethylhexasiloxane, and hexadecamethylheptasiloxane.

4. The conductive paste according to claim 2, comprising the cyclic silicone oil molecule, wherein the cyclic silicone oil molecule is at least one selected from the group consisting of decamethylcyclopentasiloxane, dodecamethylcyclohexasiloxane, and tetradecamethylcycloheptasiloxane.

5. The conductive paste according to claim 1, wherein the silicone oil comprises polydimethylsiloxane.

6. The conductive paste according to claim 1, wherein the electrically conductive particles comprise carbon, silver, gold, aluminum, platinum, palladium, tin, nickel, cadmium, gallium, indium, copper, zinc, iron, bismuth, cobalt, manganese, molybdenum, chromium, vanadium, titanium, tungsten, mixtures thereof, alloys thereof, or core-shell structures thereof.

7. The conductive paste according to claim 1, wherein the electrically conductive particles are coated with an organic additive.

8. A printed electrode on a semiconductor substrate, the printed electrode comprising the conductive paste according to claim 1.

9. A process for producing an electrode on a semiconductor substrate, the process comprising: (a) screen printing the conductive paste according to claim 1 on a semiconductor substrate in a predetermined pattern to form a printed semiconductor substrate;
   (b) drying the printed semiconductor substrate at a temperature in a range from 100 to 300° C. to obtain a dried printed semiconductor substrate;
   (c) heating the dried printed semiconductor substrate to a sintering temperature in a range from 650 to 900° C. to sinter the electrically conductive particles.

10. The process according to claim 9, wherein the drying (b) is carried out for a duration in a range from 10 to 50 sec.

11. The process according to claim 9, wherein the heating (c) comprises:
   heating the dried printed semiconductor substrate from room temperature to the sintering temperature within 5 to 50 sec;
   holding the sintering temperature for 1 to 5 sec; and
   cooling the dried printed semiconductor substrate down to room temperature within 3 to 60 sec.

12. The process according to claim 9, wherein the semiconductor substrate is a semiconductor substrate for a solar cell.

* * * * *

UNITED STATES PATENT AND TRADEMARK OFFICE
CERTIFICATE OF CORRECTION

Page 1 of 1

PATENT NO. : 10,453,974 B2
APPLICATION NO. : 16/078176
DATED : October 22, 2019
INVENTOR(S) : Markus Fiess et al.

It is certified that error appears in the above-identified patent and that said Letters Patent is hereby corrected as shown below:

In the Specification

In Column 2, Line 38, "tetradecamethylcycloheptasilaxane" should read
-- tetradecamethylcycloheptasiloxane --.

In Column 6, Line 24, "monometylether" should read -- monomethylether --.

Signed and Sealed this
Twelfth Day of May, 2020

Andrei Iancu
*Director of the United States Patent and Trademark Office*